(12) United States Patent
Schott

(10) Patent No.: US 6,297,695 B1
(45) Date of Patent: Oct. 2, 2001

(54) HIGH VOLUME EXPANDER CIRCUIT

(75) Inventor: Wayne M. Schott, Seymour, TN (US)

(73) Assignee: U.S. Philips Corporation, New York, NY (US)

(*) Notice: Subject to any disclaimer, the term of this patent is extended or adjusted under 35 U.S.C. 154(b) by 0 days.

(21) Appl. No.: 09/680,189

(22) Filed: Oct. 5, 2000

Related U.S. Application Data

(63) Continuation of application No. 09/397,744, filed on Sep. 16, 1999.

(51) Int. Cl.[7] ................................................. H03F 1/36
(52) U.S. Cl. .............................. 330/110; 330/69; 330/86; 333/14
(58) Field of Search .............................. 330/69, 86, 110; 333/14

(56) References Cited

U.S. PATENT DOCUMENTS

| | | | |
|---|---|---|---|
| 3,714,588 | * 1/1973 | Deboo et al. | 328/167 |
| 3,723,894 | * 3/1973 | Benenati | 330/29 |
| 3,757,254 | 9/1973 | Takahashi et al. | 333/14 |
| 3,798,562 | 3/1974 | Takahashi et al. | 330/28 |
| 3,911,371 | 10/1975 | Nakamura et al. | 330/28 |
| 3,986,049 | * 10/1976 | Campbell et al. | 307/237 |
| 4,450,413 | * 5/1984 | Fujibayashi | 330/279 |
| 5,936,470 | * 8/1999 | Stroud | 330/284 |

OTHER PUBLICATIONS

Program Multichaannel Audio Gain, Electronic Design 3, Feb. 1, 1975, pp. 68–72.
DBX Model 118, Dynamic Range Enhancer Instruction Manual.

* cited by examiner

Primary Examiner—Robert Pascal
Assistant Examiner—Henry Choe
(74) Attorney, Agent, or Firm—Russell Gross

(57) ABSTRACT

The present invention is directed to a circuit for performing volume expansion on an audio signal. The circuit includes an amplifier that has an input side and an output side. Further, the amplifier amplifies the audio signal at a first amplification to produce an amplified signal at the output side of the amplifier. The circuit also includes a shunting element coupled across the input side and output side of the amplifier. The shunting element includes a variable impedance device for changing the first amplification of the amplifier to a second amplification if the amplified signal reaches a predetermined threshold.

4 Claims, 8 Drawing Sheets

HIGH VOLUME EXPANDER CIRCUIT

This is a continuation of application Ser. No. 09/397,744, filed Sep. 16, 1999.

BACKGROUND OF THE INVENTION

The present invention relates generally to electronic circuits, and more particularly to a high volume expander circuit for restoring the wide dynamic signal range of an audio signal.

Various mediums such as TV, FM and two-track VCR utilize audio signals that have a limited dynamic signal range due to signal format requirements. Such signal formats require that the audio signals at high levels be limited to a predetermined level before being either transmitted or recorded. Due to this, a sound track from a TV broadcast or VCR will not have the same wide dynamic sound as that heard in a movie theater.

In view of the above, devices have been developed to restore the wide dynamic sound of such mediums. One such device is known as a linear volume expander. However, since this device is linear, the audio signals will be expanded at high voltage levels as well as lower levels. This large amount of expansion is undesirable since the sound produced can be unpleasant to the listener. Therefore, it would be desirable to perform volume expansion at high signal levels only.

SUMMARY OF THE INVENTION

The present invention is directed to a circuit for performing volume expansion on an audio signal. The circuit includes an amplifier that has an input side and an output side. Further, the amplifier amplifies the audio signal at a first amplification to produce an amplified signal at the output side of the amplifier. The circuit also includes a shunting element coupled across the input side and output side of the amplifier. The shunting element includes a variable impedance device for changing the first amplification of the amplifier to a second amplification if the amplified signal reaches a predetermined threshold.

The present invention is also directed to a method for performing volume expansion on an audio signal. The method includes amplifying the audio signal at a first amplification to produce an amplified signal. Further, defining a predetermined threshold and then changing the first amplification to a second amplification if the amplified signal reaches the predetermined threshold.

BRIEF DESCRIPTION OF THE DRAWINGS

Referring now to the drawings where like reference numbers represent corresponding parts throughout.

DETAILED DESCRIPTION

The present invention is directed to a high volume expander circuit for restoring the wide dynamic signal range of an audio signal. As previously described, audio signals utilised in various mediums have a limited dynamic range due to the audio signals at high signal levels being limited to a predetermined level. In order to overcome this limitation, the present invention selectively expands an audio signal only at this predetermined level.

Figure 1:
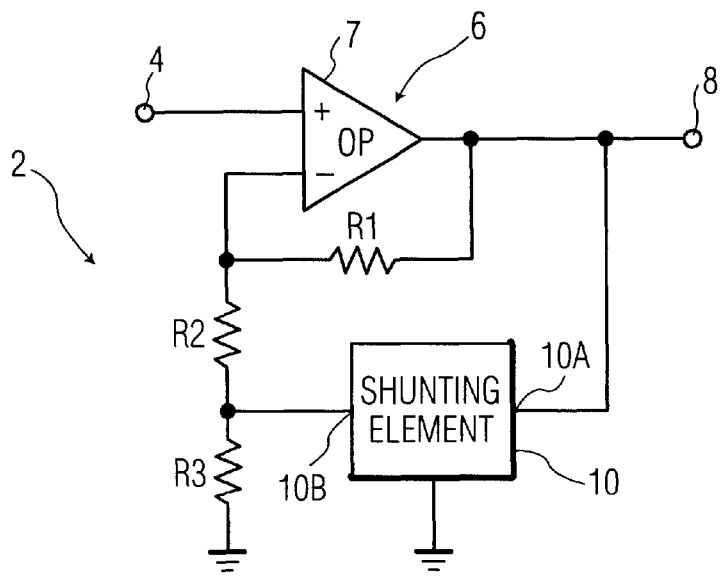
FIG. 1 is a diagram illustrating the concept of the high volume expander circuit according to the present invention.

The concept of the high volume expander circuit according to the present invention is shown in FIG. 1. The circuit 2 includes an amplifier 6 and a shunting element 10. The amplifier 6 is connected between an input terminal 4 and an output terminal 8. As can be seen, the amplifier 6 includes an op Amp 7 and gain resistors R1, R2, R3.

The shunting element 10 includes a first terminal 10A connected across the output of the amplifier 6 and a second terminal 10B connected across one of the resistors R3. The shunting element 10 is utilised in order to control the gain of the amplifier 6 based on the voltage level of the signal developed at the output of the amplifier 6. In particular, the shunting element 10 is configured to be turned on in response to the voltage level of the output signal reaching a predetermined threshold level. This predetermined threshold corresponds to the voltage level at which the audio signal is originally limited to due to the signal format of the medium. Therefore, the shunting element 10 is configured to have a predetermined threshold that corresponds to the signal format of the medium that the circuit 2 is being utilised with.

During operation, audio signals are applied to the input terminal 4 so that amplified signals are produced at the output terminal 8 of the amplifier 6. The gain of the amplifier 6 is controlled by the shunting element 10. If the shunting element 10 is turned off, the gain (A1) of the amplifier 6 will be the following:

$$A1 = 1 + R1/(R2+R3) \quad (1)$$

If the voltage level of a signal at the output of the amplifier 6 reaches the threshold of the shunting element 10, the shunting element 10 will be turned on to shunt current away from resistor R3. Thus, R3 will be effectively removed from the circuit and the gain (A2) of the amplifier 6 will be increased to the following:

$$A2 = 1 + R1/R2 \quad (2)$$

If the voltage level of the signal at the output of the amplifier 6 falls below the threshold, the shunting element 10 will be turned off and the gain of the amplifier 6 will be changed back to Equation 1. According to this process, the audio signals will be selectively expanded only at the high voltage levels thereby restoring the wide dynamic signal range.

Figure 2:
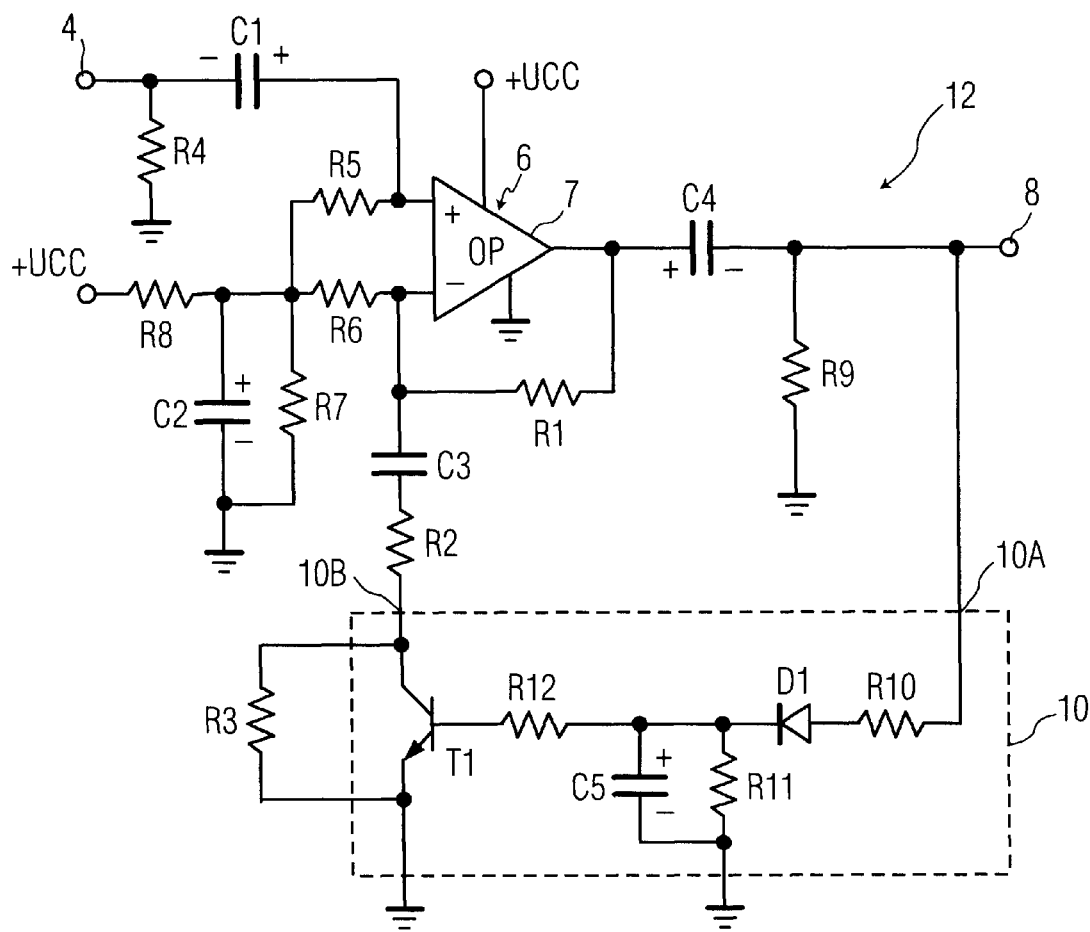
FIG. 2 is a diagram of the high volume expander circuit according to one embodiment the present invention.

FIG. 2 shows one embodiment of the high volume expander circuit according to the present invention. The circuit 12 operates the same as the concept shown in FIG. 1. As previously described, the shunting element 10 is utilized to control the gain of the amplifier 6 in response to the voltage level of the signals developed at the output of the amplifier 6. This is accomplished by eliminating one of the resistors R3 from the gain of the amplifier 6 in response to the threshold of the shunting element 10 being reached. Therefore, the gains of Equations 1 and 2 also apply.

As can be seen from FIG. 2, the components that make up the shunting element 10 are enclosed in the broken line. The shunting element 10 includes a bipolar transistor T1 that is connected between the second terminal 10B and ground. The transistor T1 is utilized as a variable impedance device to shunt current away from one of the resistors R3 in response to the threshold of the shunting element 10 being reached. During operation, the voltage at the first terminal 10A will normally be about 0.3 volts. Thus, it is preferred that the shunting element 10 includes a diode D1 to provide a higher threshold voltage. As can be seen, the diode D1 is coupled to the base of the transistor T1 through resistor R12. Therefore, the threshold voltage is equal to the sum of the turn-on voltages of both the transistor T1 and the diode D1.

Further, it also preferable that the shunting element 10 includes time delays in its turn-on and turn-off times. This will provide a more gradual transition between the higher and lower gains of the amplifier 6, which makes the sound produced by the volume expanded audible signals more pleasant when heard. The turn-on delay is determined by the time constant formed by resistor R10 and capacitor C5. The turn-off delay is determined by the time constant formed by capacitor C5 and resistors R11,R12.

The circuit 12 also includes additional components necessary for a practical application. For example, de-coupling capacitors C1, C3, C4 are included, which are utilized to block DC voltages. Resistors R4, R9 serve as bleed-off resistors for the de-coupling capacitors C1, C4. Bias resistors R5, R6 provide the proper biasing voltages for the inputs of the operational amplifier 7P, which is necessary when using a single power supply VCC. Further, capacitor C2 serves as a filter for the power supply VCC.

Figure 3:
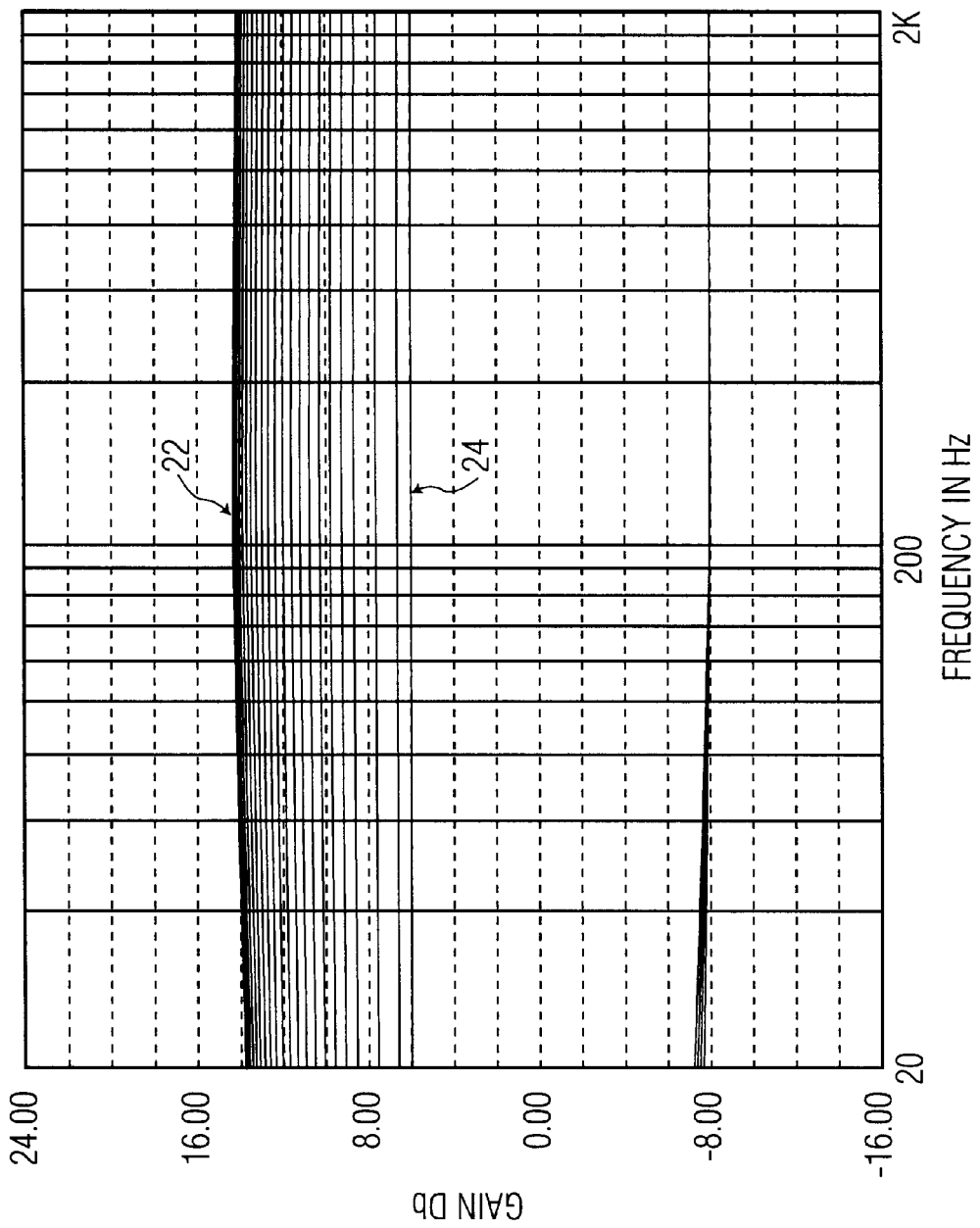
FIG. 3 is a graph illustrating the frequency response for the circuit of FIG. 2.

FIG. 3 shows the frequency response for the circuit of FIG. 2. A first curve 22 represents the higher gain of the amplifier 6 when the shunting element 10 is turned on and a second curve 24 represents the lower gain of the amplifier when the shunting element is turned off. As can be seen, the first curve has a fairly flat response in the 20 to 2 KHz range. Thus, the circuit of FIG. 2 will perform volume expansion throughout this range of frequencies. However, in some applications such a response may not be desirable. For example, in order to avoid bass overloading in speakers, it may be desirable to limit the volume expansion of the circuit to just middle to high frequencies.

Figure 4:
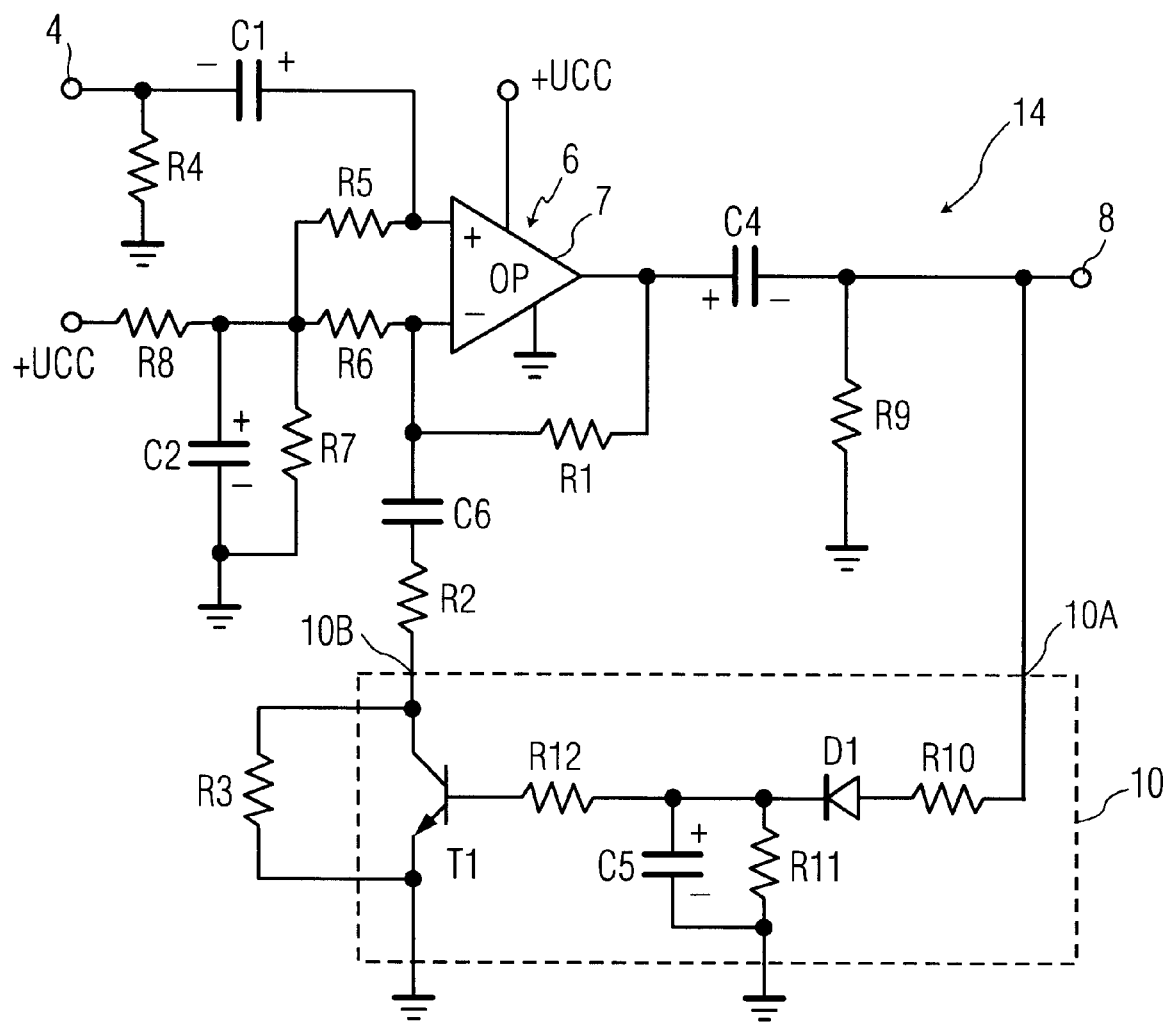
FIG. 4 is a diagram of the high volume expander circuit according to another embodiment of the present invention.

Another embodiment of the high volume expander circuit according to the present invention is shown in FIG. 4. This embodiment 14 is the same as the embodiment shown in FIG. 2 except that capacitor C3 has been changed to a smaller value capacitor C6. The capacitor C6 having a smaller value blocks lower frequency signals. Thus, the signal response of this embodiment 14 will be changed so that the volume expansion occurs only at middle to high frequencies. As previously described, this avoids any bass overloading problems from occurring.

Figure 5:
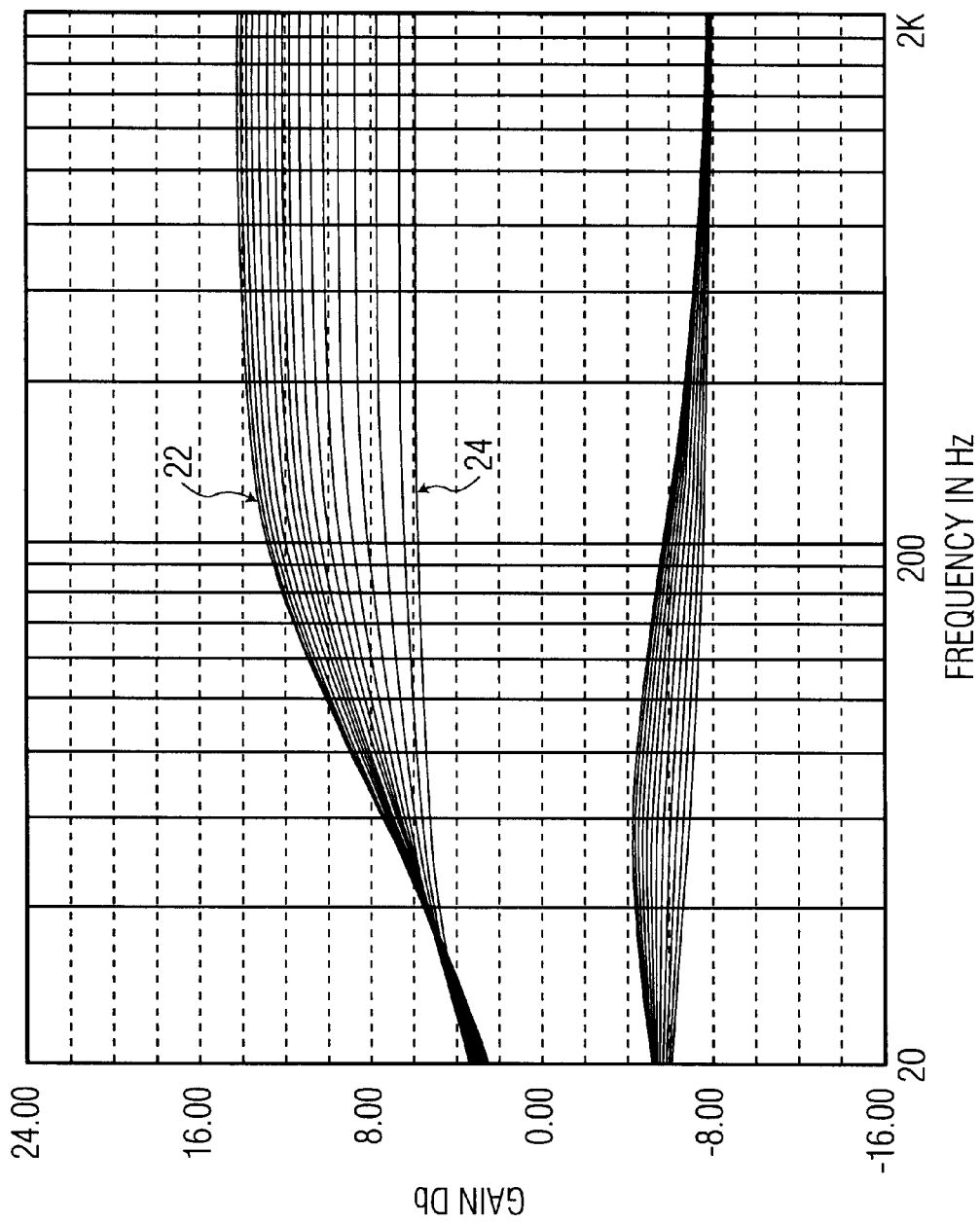
FIG. 5 is a graph illustrating the frequency response for the circuit of FIG. 4.

FIG. 5 shows the frequency response for the circuit of FIG. 4. The second curve 22' represents the higher gain of the amplifier 6 when the shunting element 10 is turned-on. Therefore, the circuit of FIG. 4 will only perform volume expansion in the middle to high frequencies, as previously described.

Figure 6:
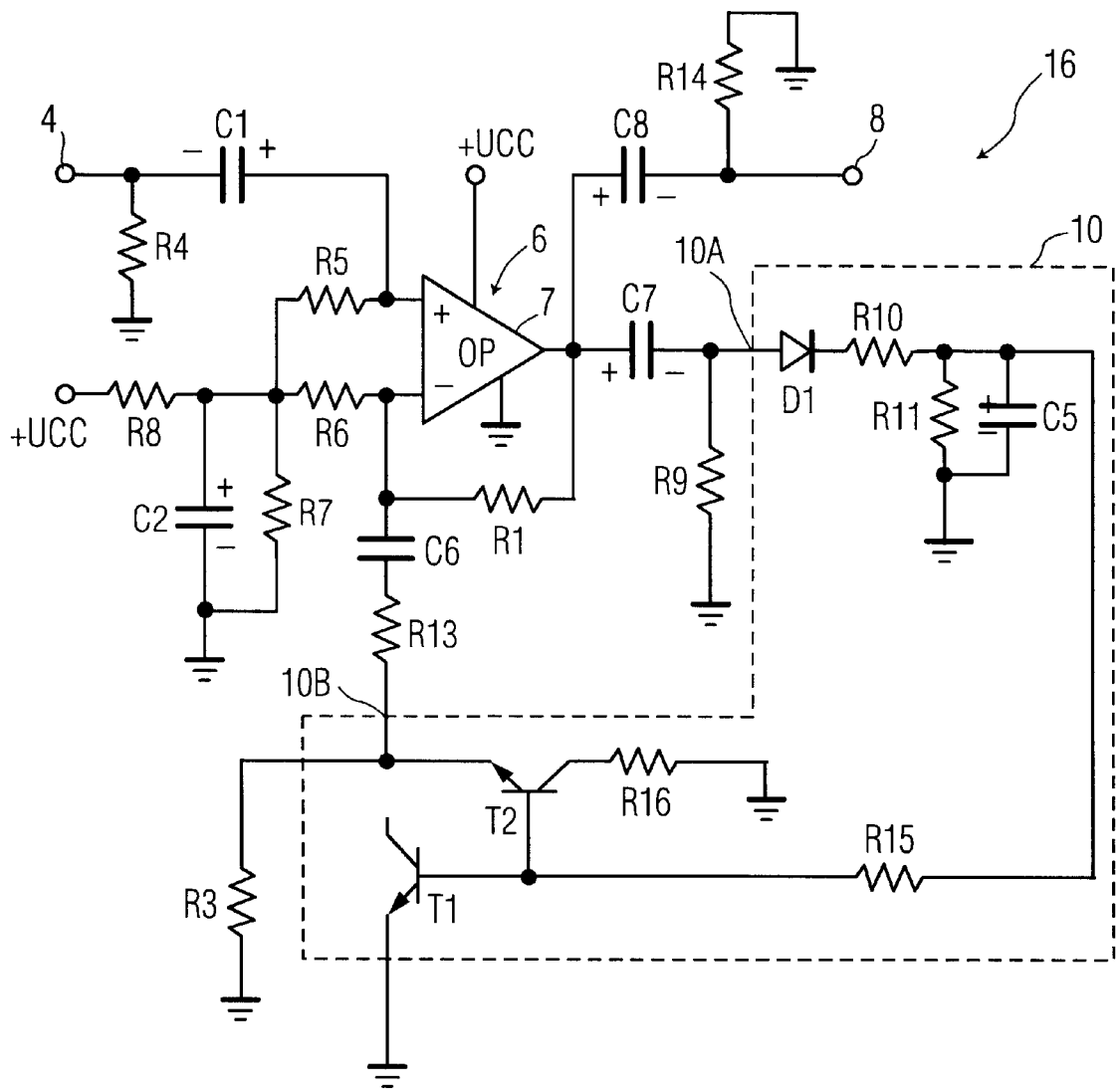
FIG. 6 is a diagram of the high volume expander circuit according to another embodiment of the present invention.

Another embodiment of the high volume expander circuit according to the present invention is shown in FIG. 6. This embodiment 14 is the same as the embodiment shown in FIG. 2 except that the shunting element 10 has been changed. In this embodiment 16, the shunting element 10 now includes a second transistor T2 and a resistor R16. As can be seen, the base of T2 is connected to the base of T1 and the emitter of T2 is connected to the collector of T1. Further, the resistor 16 is connected between the collector of the transistor T2 and ground.

The above-described configuration of the shunting element 10 prevents non-linearities from occurring in the circuit 16. Such non-linearities occur due to the transistor T1 being non-linear in response to positive going AC signals versus negative going signals in its shunting action. This condition can cause the output of the circuit 16 to have a significant amount of distortion. However, these non-linearities are avoided since the second transistor T2 will also begin turn on when the first transistor T1 does. Therefore, the first transistor T1 will not receive all of the current provided through R15 and thus will not be turned on as hard in response to positive going signals.

Figure 7:
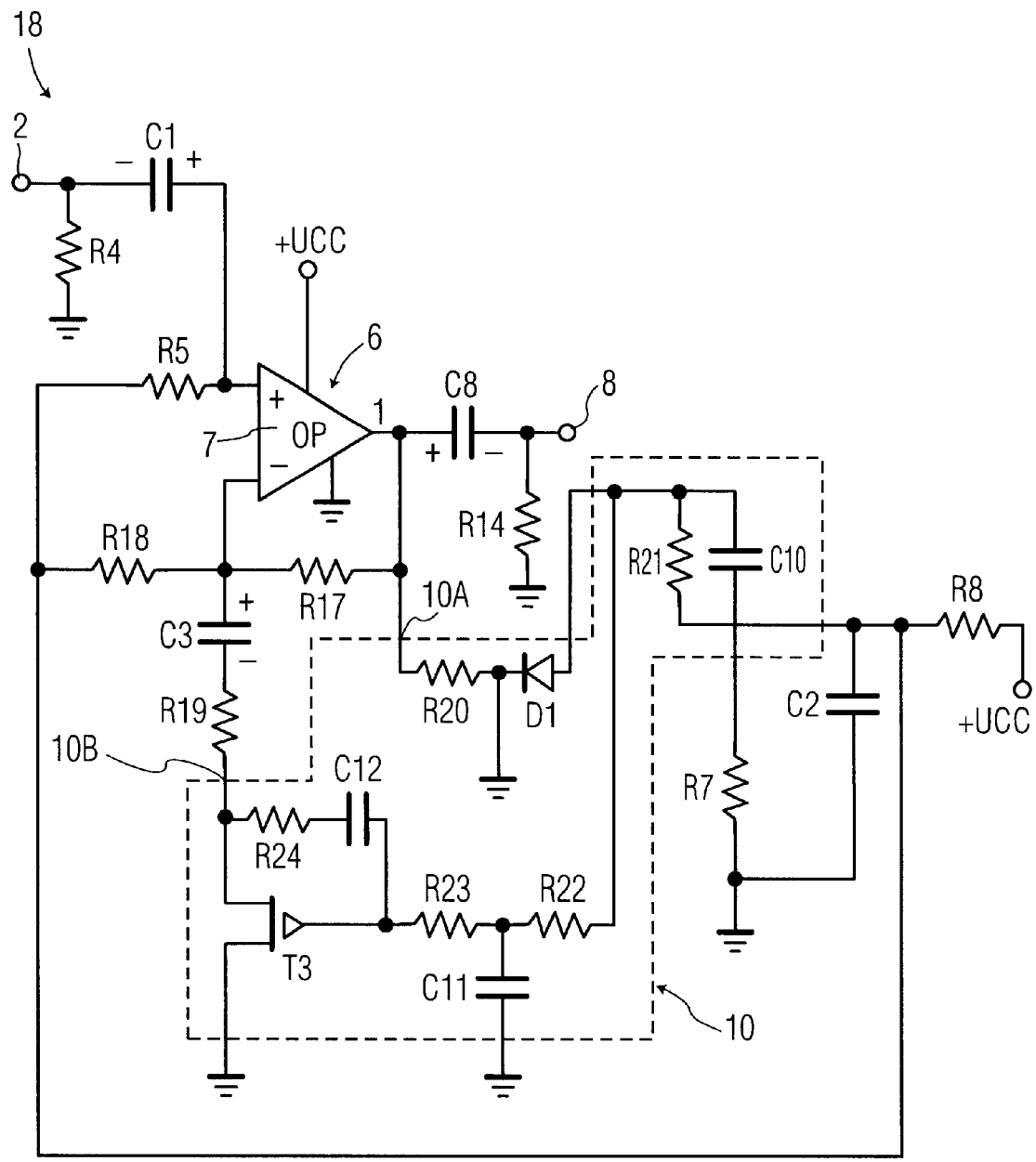
FIG. 7 is a diagram of the high volume expander circuit according to another embodiment of the present invention.

Another embodiment of the high volume expander circuit according to the present invention is shown in FIG. 7. In this embodiment 18, the amplifier 6 also includes an op amp 7 and resistors R17, R18, R19. However, as can be seen from FIG. 7, the shunting element 10 is not connected across one of these resistors. Instead, the shunting element 10 is connected in series with one of the resistors R19. Thus, if the shunting element 10 is turned off, the gain (A1) of the amplifier 6 is the following:

$$A1 = 1 + R17/R18 \tag{3}$$

When the shunting element 10 is turned on, the gain (A2) of the amplifier is raised to the following:

$$A2 = 1 + R17/R18/R19 \tag{4}$$

Further, in this embodiment 18, the shunting element 10 includes a JFET T3 as the variable impedance device. The JFET T3 is normally in the off-state due to biasing resistors R7, R8 keeping capacitor C11 at a half of the supply voltage VCC. Half of the supply voltage VCC should be equal to or greater than the pinch-off voltage of the JFET T3. Further, the diode D1 has been reversed from the previous embodiments. Thus, the threshold voltage of the shunting element 10 in this embodiment 18 will be negative. In contrast, the previous embodiments had a positive threshold voltage.

If the voltage at the first terminal 10A is above the negative threshold, the JFET T3 will be turned off and the gain of the amplifier 6 will be equal to Equation 3. However, if the voltage at the first terminal 10A falls to the negative threshold, the diode D1 will conduct and cause the voltage of the capacitor C11 to fall below the pinch-off voltage of the JFET T3. The JFET T3 will then be turned on and the gain of the amplifier 6 will increase to Equation (4). As previously described, the increased gain will cause the audio signals to be selectively expanded at the high voltage levels.

In this embodiment 18, capacitor C10 and resistor R20 form a time constant that determines the turn-on delay of the shunting element 10. The capacitor C10 and resistor R21 form another time constant that determines the turn-off delay of this shunting element 10. As previously described, these delays makes the sound produced by an expanded audio signal more pleasant to be heard.

As can be further seen from FIG. 7, a resistor R24 in series with a capacitor C12 is connected across the gate and drain of the JFET T3. The resistor R24 and capacitor C12 serve as feedback loop to prevent the JFET T3 from turning on too hard in response to positive going AC signals. Thus, this will prevent any non-linearities from occurring in the circuit 18.

Resistor R23 connected to the gate of the JFET T3 is utilized to isolate the rest of the circuit from this feedback loop. Capacitors C9, C1 are utilized as AC filters, while resistors R5, R7, R8, R18 provide biasing for the op amp 7.

Figure 8:
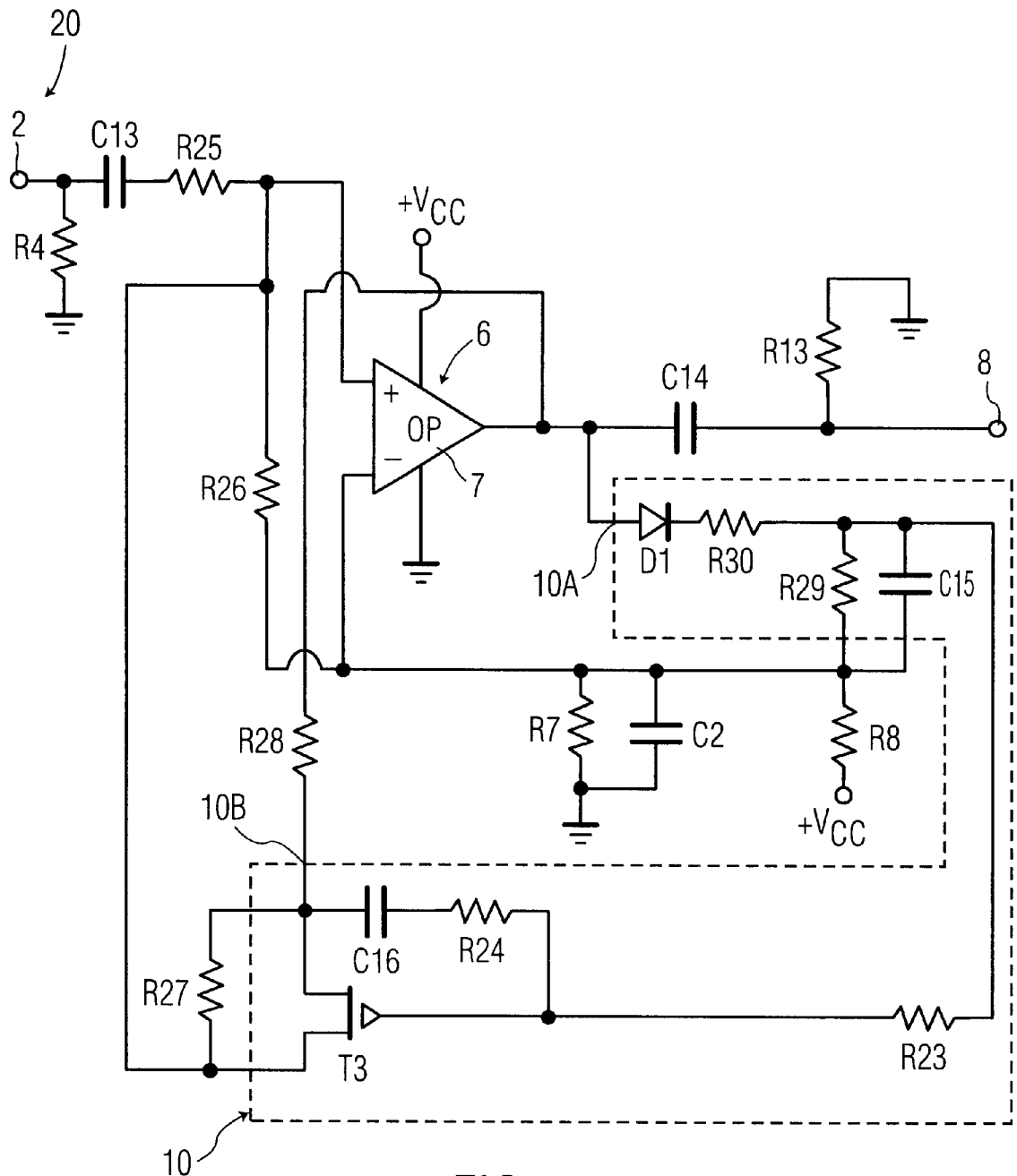
FIG. 8 is a diagram of the high volume expander circuit according to a further embodiment of the present invention.

A further embodiment of the high volume expander circuit according to the present invention is shown in FIG. 8. In this embodiment 20, the JFET T3 is normally turned on since capacitor C15 is kept normally below the pinch-off voltage of the JFET T3. Thus, resistor R27 is not included in the circuit, which means that the gain (A1) of the amplifier 6 will be the following:

$$A1=R28/R25 \quad (5)$$

When the shunting element 10 is turned-off, the resistor R27 is then included in the circuit and the gain (A2) of the amplifier is then raised to the following:

$$A2=(R27+R28)/R25 \quad (6)$$

In this embodiment 20, the threshold voltage will turn off the shunting element 10. Thus, the threshold voltage is equal to the sum of the turn-on voltage of the diode D1 and the pinch-off voltage of the JFET T3. If the first terminal 10A reaches this threshold voltage, a capacitor C15 will rise to the pinch-off voltage of the JFET T3. The JFET T3 will then be turned off and the gain of the amplifier 6 will be increased to Equation 6. As previously described, the increased gain will cause the audio signals to be selectively expanded at high levels. When the voltage at the first terminal 10A falls below the threshold voltage, the JFET T3 will turn on and the gain of the amplifier 6 will be lowered to Equation 5.

Similar to the embodiment of FIG. 7, the resistor R24 and capacitor C16 serve as feedback loop to prevent any non-linearities from occurring in the circuit 20. Still referring to FIG. 8, capacitor C15 and resistor R30 form a time constant that determines the turn-on delay of this shunting element 10. The capacitor C15 and resistor R29 form another time constant that determines the turn-off delay of the shunting element 10. As previously described, these delays makes the sound produced by the expanded audio signal more pleasant when heard. Further, resistors R7, R8, R26 provide biasing for the op amp 7P, while the capacitor C2 serves as a filter for the power supply VCC.

Figure 9:
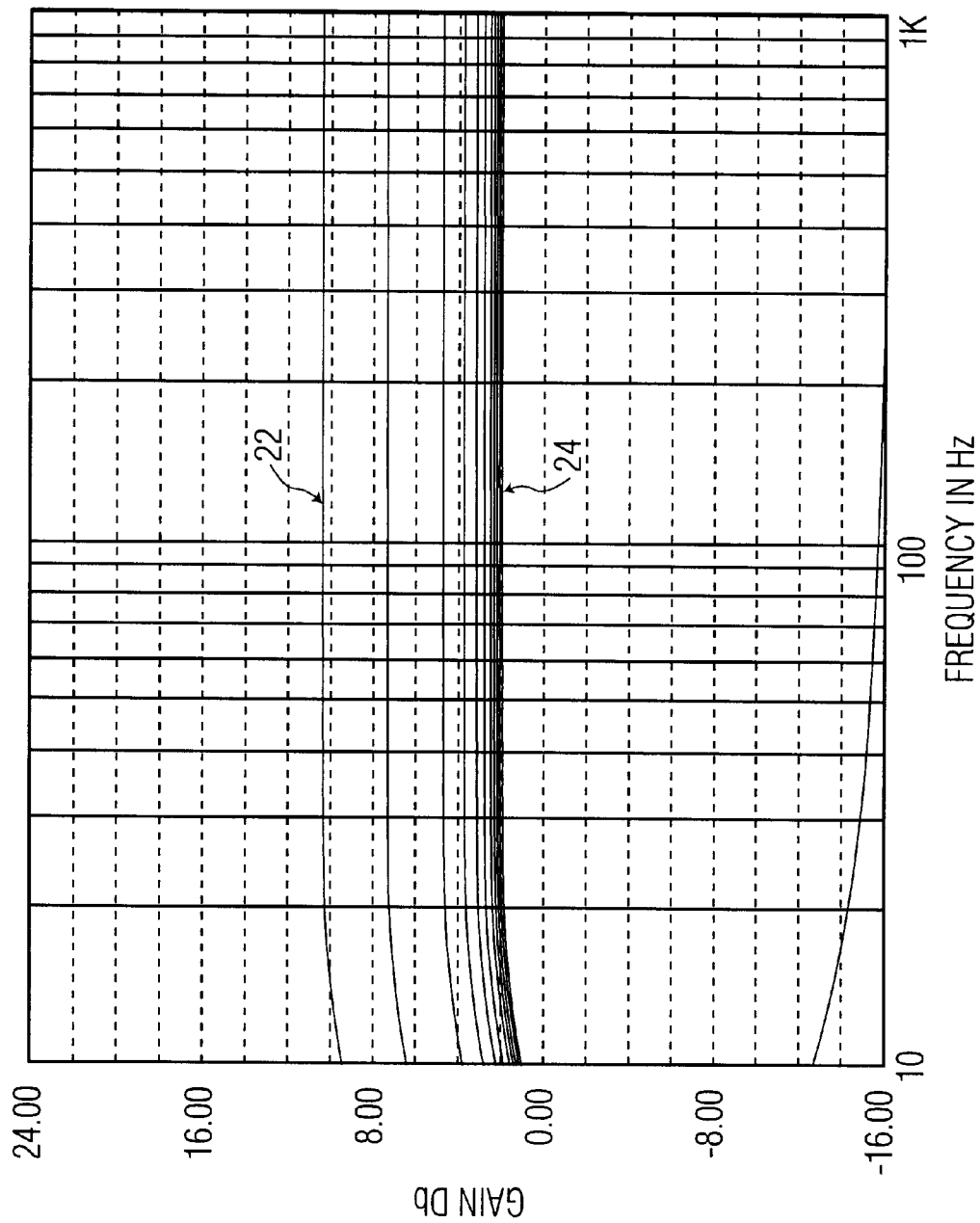
FIG. 9 is a graph illustrating the frequency response for the circuit of FIG. 9.

FIG. 9 shows the frequency response for the circuit of FIG. 8. The first curve 22 represents the higher gain of the amplifier 6 when the shunting element 10 is turned off. The second curve 24 represents the lower gain of the amplifier 6 when the shunting element is turned-on. As can be seen, the first curve has a fairly flat response in the 10 to 1 KHz range.

The foregoing description of the invention has been presented for the purposes of illustration and description. It is not intended to limit the invention to the precise forms disclosed. Many modifications and variations are possible in light of the above teachings. Therefore, it is not intended that the scope of the invention should be limited by the detail description.

The following is a list of components for the embodiments described herein:

| | | |
|---|---|---|
| C1-5 $\mu$F | OP-LF353 | R14-100 K |
| C2-100 $\mu$F | T1-2N2222 | R15-33 K |
| C3-22 $\mu$F | T2-2N2222 | R16-220 |
| C4-22 $\mu$F | T3-2N5270 | R17-22 K |
| C5-1 $\mu$F | R1-15 K | R18-5.6 K |
| C6-0.33 $\mu$F | R2-2.7 K | R19-3.9 K |
| C7-1 $\mu$F | R3-15 K | R20-2.7 K |
| C8-5 $\mu$F | R4-100 K | R21-2 M |
| C9-0.47 $\mu$F | R5-100 K | R22-100 K |
| C10-0.47 $\mu$F | R6-100 K | R23-1 M |
| C11-0.22 $\mu$F | R7-1 K | R24-1 M |
| C12-0.01 $\mu$F | R8-1 K | R25-10 K |
| C13-4.7 $\mu$f | R9-4.7 K | R26-10 K |
| C14-4.7 $\mu$F | R10-3.9 K | R27-22 K |
| C15-2.2 $\mu$F | R11-1 M | R28-12 K |
| C16-0.1 $\mu$F | R12-220 K | R29-1 M |
| D1-1N4148 | R13-3.3 K | R30-4.7 K |
| | | R31-10 K |

What is claimed is:

1. A circuit for performing volume expansion on an audio signal, comprising:

an amplifier having an input side and an output side, the amplifier amplifying the audio signal at a first amplification to produce an amplified signal at the output side of the amplifier, wherein the amplifier includes an operational amplifier and resistors;

a shunting element coupled across the input side and output side of the amplifier, the shunting element for changing the first amplification of the amplifier to a second amplification if the amplified signal reaches a predetermined threshold;

the shunting element including a bipolar transistor and a diode coupled to the base of the bipolar transistor;

wherein the threshold voltage is determined by the bipolar transistor and the diode.

2. A circuit for performing volume expansion on an audio signal, comprising:

an amplifier having an input side and an output side, the amplifier amplifying the audio signal at a first amplification to produce an amplified signal at the output side of the amplifier, wherein the amplifier includes an operational amplifier and resistors;

a shunting element coupled across the input side and output side of the amplifier, the shunting element for changing the first amplification of the amplifier to a second amplification if the amplified signal reaches a predetermined threshold;

the shunting element including a JFET transistor and a diode coupled to a gate of the JFET;

wherein the threshold voltage is determined by the JFET and the diode.

3. The circuit of claim 2, wherein the JFET is connected in parallel with one of the resistors.

4. The circuit of claim 2, wherein the JFET is connected in series with one of the resistors.

* * * * *